(12) United States Patent
Louie et al.

(10) Patent No.: US 11,334,288 B2
(45) Date of Patent: May 17, 2022

(54) MRAM ACCESS COORDINATION SYSTEMS AND METHODS WITH A PLURALITY OF PIPELINES

(71) Applicant: Integrated Silicon Solution, (Cayman) Inc., Grand Cayman (KY)

(72) Inventors: Benjamin Louie, Fremont, CA (US); Neal Berger, Cupertino, CA (US); Lester Crudele, Tomball, TX (US)

(73) Assignee: Integrated Silicon Solution, (Cayman) Inc., Grand Cayman (KY)

( * ) Notice: Subject to any disclaimer, the term of this patent is extended or adjusted under 35 U.S.C. 154(b) by 0 days.

(21) Appl. No.: 16/442,345

(22) Filed: Jun. 14, 2019

(65) Prior Publication Data

US 2019/0303044 A1 Oct. 3, 2019

Related U.S. Application Data

(63) Continuation-in-part of application No. 16/275,088, filed on Feb. 13, 2019, now Pat. No. 10,818,331, which is a continuation-in-part of application No. 16/118,137, filed on Aug. 30, 2018, now Pat. No. 10,546,625, which is a continuation-in-part of
(Continued)

(51) Int. Cl.
*G06F 3/06* (2006.01)
*G11C 11/16* (2006.01)
*G11C 29/00* (2006.01)

(52) U.S. Cl.
CPC .......... *G06F 3/0659* (2013.01); *G06F 3/0604* (2013.01); *G06F 3/0644* (2013.01); *G06F 3/0673* (2013.01); *G11C 11/1659* (2013.01); *G11C 11/1693* (2013.01);
(Continued)

(58) Field of Classification Search
CPC .... G06F 3/0659; G06F 3/0604; G06F 3/0644; G06F 3/0673; G11C 11/1659; G11C 11/1693; G11C 11/1677; G11C 11/1673; G11C 11/1675; G11C 29/846
See application file for complete search history.

(56) References Cited

U.S. PATENT DOCUMENTS 3,312,950 A * 4/1967 Hillman ................. G06F 13/22
710/45
2008/0106961 A1 * 5/2008 Saito ................... G06F 13/1631
365/203

(Continued)

*Primary Examiner* — Sultana Begum

(57) ABSTRACT

Embodiments of the present invention facilitate efficient and effective increased memory cell density configuration. In one embodiment, a memory system comprises: an array of addressable memory cells, wherein the addressable memory cells of the array comprise magnetic random access memory (MRAM) cells and wherein further the array is organized into a plurality of banks; an engine configured to control access to the addressable memory cells organized into the plurality of banks; and a pipeline configured to perform access control and communication operations between the engine and the array of addressable memory cells. At least a portion of operations associated with accessing at least a portion of one of the plurality of memory banks via the pipeline are performed substantially concurrently or in parallel with at least a portion of operations associated with accessing at least another portion of one of the plurality of memory banks via the pipeline.

16 Claims, 14 Drawing Sheets

Related U.S. Application Data application No. 15/855,855, filed on Dec. 27, 2017, now Pat. No. 10,192,602, which is a continuation-in-part of application No. 15/277,799, filed on Sep. 27, 2016, now Pat. No. 10,366,774.

(60) Provisional application No. 62/691,506, filed on Jun. 28, 2018, provisional application No. 62/685,218, filed on Jun. 14, 2018.

(52) U.S. Cl.
CPC ........ *G11C 29/846* (2013.01); *G11C 11/1673* (2013.01); *G11C 11/1675* (2013.01); *G11C 11/1677* (2013.01)

(56) References Cited

U.S. PATENT DOCUMENTS

| | | | |
|---|---|---|---|
| 2009/0066790 A1* | 3/2009 | Hammadou | G08B 13/19636 348/143 |
| 2011/0032997 A1* | 2/2011 | Chua | H04N 19/44 375/240.25 |
| 2011/0267899 A1* | 11/2011 | Kim | G11C 29/846 365/189.05 |

* cited by examiner

MRAM ACCESS COORDINATION SYSTEMS AND METHODS WITH A PLURALITY OF PIPELINES

RELATED APPLICATIONS

Cross-Reference to Related Applications

This application claims benefit of and priority to U.S. Provisional Patent Application No. 62/685,218, entitled "MRAM READ AND WRITE SCHEME FOR DDR", filed on Jun. 14, 2018, which is incorporated herein by reference. This application is a Continuation in part of and claims benefit of and priority to U.S. patent application Ser. No. 16/275,088, entitled "A MUTI-CHIP MODULE FOR MRAM DEVICES", filed on Feb. 13, 2019, which is a conversion of and claims priority to and the benefit of Provisional Patent Application No. 62/691,506, entitled "MRAM ENGINE MULTI CHIP MODULE," having a filing date of Jun. 28, 2018, and is also a Continuation-in-part of and claims the benefit and priority to U.S. application Ser. No. 16/118,137, filed Aug. 30, 2018, entitled "A METHOD OF OPTIMIZING WRITE VOLTAGE BASED ON ERROR BUFFER OCCUPANCY," which is a Continuation-in-part of and claims the benefit and priority to U.S. application Ser. No. 15/855,855, filed Dec. 27, 2017, entitled "SMART CACHE DESIGN TO PREVENT OVERFLOW FOR A MEMORY DEVICE WITH A DYNAMIC REDUNDANCY REGISTER,", which is a continuation-in-part of and claims the benefit of and priority to U.S. application Ser. No. 15/277,799 filed Sep. 27, 2016, entitled "DEVICE WITH DYNAMIC REDUNDANCY REGISTERS", all of which are hereby incorporated by reference in their entirety.

FIELD OF THE INVENTION

The present invention relates to the field of memory device structure fabrication.

BACKGROUND OF THE INVENTION

Electronic systems and devices have made a significant contribution towards the advancement of modern society and have facilitated increased productivity and reduced costs in analyzing and communicating information in a variety of business, science, education, and entertainment applications. These electronic systems and devices typically include different information storage capabilities and requirements. Coordinating storage operations with the different capabilities and requirements is traditionally complicated and often not possible.

Different types of memory typically have different characteristics and requirements. Traditional magnetoresistive random-access memory (MRAM) has a higher write current than dynamic random access memory (DRAM). Conventional DRAM double data rate (DDR) memory usually uses a larger page size (e.g., 512B, 1 KB, 2 KB, etc.). Conventional MRAM write operations typically use relatively high current/power which tends to limit sizes of page buffers. Conventional MRAM use of smaller page sizes make it traditionally incompatible with systems that use DDR DRAM controllers. This incompatibility typically prevents systems with DDR DRAM controllers from taking advantage of the benefits associated with MRAM memory.

SUMMARY

Embodiments of the present invention facilitate efficient and effective increased memory cell density configuration. In one embodiment, a memory device comprises: an array of addressable memory cells, an error buffer operable to store write operations requiring a rewrite operation for storage into the array; a plurality of read/write pipelines operable to process read and write operations for the array, and an engine operable to control at least two read/write pipelines of the plurality of read/write pipelines and for controlling operations concerning the error buffer. With respect to a plurality of banks having a first and a second read/write pipeline associated therewith, while the first read/write pipeline is processing a first read and/or write operation to one of the plurality of banks, but not yet finished, the second read/write pipeline is operable to commence processing a second read and/or write operation to another one of the plurality of banks. The addressable memory cells of the array can comprise magnetic random access memory (MRAM) cells and wherein further the array is organized into a plurality of banks in a bank group. In one exemplary implementation, the bank group has associated therewith at least two respective read/write pipelines of the plurality of read/write pipelines.

In one embodiment, the first plurality of read and/or write operations to one of the plurality of banks are directed to a particular page of one of the plurality of banks and originate from a double data rate (DDR) interface issuing first memory operations to the particular page. The second plurality of read and/or write operations to another one of the plurality of banks can be directed to another particular page of another one of the plurality of banks and originate from the DDR interface issuing second memory operations to the other particular page. The engine can comprise a pipeline scheduler coupled to the first and second read/write pipelines and operable to assign memory operations directed at least one of the plurality of banks between the first and second read/write pipelines. A burst word is read from the magnetic random access memory (MRAM) cells during time allotted by the DDR interface requirements to respond to a page activate command. In one exemplary implementation, a plurality of burst words corresponding to a bus width can be read from the magnetic random access memory (MRAM) cells during time allotted by the DDR interface requirements to respond to a page activate command.

In one embodiment, a memory chip comprises: an array of addressable magnetic random access (MRAM) memory cells organized into a plurality of banks, a plurality of error buffers operable to store write operations requiring a rewrite operation for storage into the array, a plurality of read/write pipelines operable to process read and write operations for the array, wherein each bank of the plurality of banks has associated therewith at least two respective read/write pipelines of the plurality of read/write pipelines, and a plurality of engines operable to control the plurality of read/write pipelines and for controlling operations concerning the plurality of error buffers. Each engine of the plurality of engines is operable to control at least two respective read/write pipelines associated with a respective bank of the plurality of banks. With respect to a particular bank having a first and a second read/write pipeline associated therewith, while the first read/write pipeline is processing a first plurality of read and/or write operations to the particular bank, but not yet finished, the second read/write pipeline is operable to commence processing a second plurality of read and/or write operations to the particular bank.

In one embodiment, a memory chip comprises: an array of addressable magnetic random access memory (MRAM) cells organized into a plurality of banks and a plurality of bank groups wherein each bank group comprises a respective set of banks; a plurality of error buffers operable to store write operations requiring a rewrite operation for storage into the array; a plurality of read/write pipelines operable to process read and write operations for the array, wherein each bank of the plurality of banks has associated therewith at least two respective read/write pipelines of the plurality of read/write pipelines; and a plurality of engines operable to control the plurality of read/write pipelines and for controlling operations concerning the plurality of error buffers. Each engine of the plurality of engines controls respective read/write pipelines associated with a respective bank group of the plurality of bank groups. In one embodiment, a particular bank having a first and a second read/write pipeline associated therewith, while the first read/write pipeline is processing a first plurality of read and/or write operations to the particular bank, but not yet finished, the second read/write pipeline is operable to commence processing a second plurality of read and/or write operations to the particular bank.

In one embodiment, a method of performing memory operations comprises: receiving at a memory device, a page open command from a DDR interface, for opening a page; receiving a first plurality of memory operations from the DDR interface directed to the page wherein the page resides within a particular bank of the plurality of banks; directing the first plurality of memory operations to a first read/write pipeline associated with the particular bank for execution thereof; before the first plurality of memory operations are complete, receiving a second plurality of memory operations from the DDR interface directed to the page; directing the second plurality of memory operations to a second read/write pipeline associated with the particular bank for execution thereof; and receiving a page close command from the DDR interface. In one exemplary implementation, the memory device comprises: an array of addressable magnetic random access memory (MRAM) cells organized into a plurality of banks; an error buffer operable to store write operations requiring a rewrite operation for storage into the array; a plurality of read/write pipelines operable to process read and write operations for the array, wherein each bank of the plurality of banks has associated therewith at least two respective read/write pipelines of the plurality of read/write pipelines; and an engine operable to control at least two read/write pipelines of the plurality of read/write pipelines and for controlling operations concerning the error buffer. In one embodiment, a burst word is read from the magnetic random access memory (MRAM) cells during time allotted by the DDR interface requirements to respond to a page activate command. In one exemplary implementation, a plurality of burst words corresponding to a bus with are read from the magnetic random access memory (MRAM) cells during time allotted by the DDR interface requirements to respond to a page activate command.

In one embodiment, a memory system comprises: an array of addressable memory cells, wherein the addressable memory cells of the array comprise magnetic random access memory (MRAM) cells and wherein further the array is organized into a plurality of banks; an engine configured to control access to the addressable memory cells organized into the plurality of banks; and a pipeline configured to perform access control and communication operations between the engine and the array of addressable memory cells. At least a portion of operations associated with accessing at least a portion of one of the plurality of memory banks via the pipeline are performed substantially concurrently or in parallel with at least a portion of operations associated with accessing at least another portion of one of the plurality of memory banks via the pipeline.

In one embodiment, operations associated with accessing at least a portion of one of the plurality of memory banks are coordinated to compensate for differences in operational requirements of a memory controller and operational constraints of the array of addressable memory cells restrictions. The substantially concurrent or parallel pipelines operations can enable the array of addressable memory cells to meet data output response timing requirements of a memory controller operating in accordance with requirements corresponding to a different type of memory than the addressable memory cells comprising magnetic random access memory (MRAM) cells. The substantially concurrent or parallel pipelines operations can enable the array of addressable memory cells to meet data output response timing requirements of a dynamic random access memory (DRAM) controller accessing the addressable memory cells comprising magnetic random access memory (MRAM) cells. The engine can serve a first one of the plurality of banks and a second one of the plurality of banks. The first one of the plurality of bank and the second first one of the plurality of banks can be included in a memory banc group, wherein the engine serves the memory bank group.

DESCRIPTION OF THE DRAWINGS

The accompanying drawings, which are incorporated in and form a part of this specification, are included for exemplary illustration of the principles of the present invention and not intended to limit the present invention to the particular implementations illustrated therein. The drawings are not to scale unless otherwise specifically indicated.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one ordinarily skilled in the art that the present invention may be practiced without these specific details. In other instances, well known methods, procedures, components, and circuits have not been described in detail as not to unnecessarily obscure aspects of the current invention.

Embodiments of the present invention facilitate efficient and effective coordination of memory characteristics with memory controller requirements. In one embodiment, a system and method coordinates responses from a memory component configured in accordance with a first access time with a memory controller configured to operate in accordance with a second access time. In one exemplary, implementation a MRAM device has an access time of 10 to 20 nanoseconds and a DRAM controller operates at an access time of 50 to 70 nanoseconds. In one embodiment, a coordination component or scheduler coordinates access to information to compensate for the access time difference.

In one embodiment, a system and method coordinates responses from a memory component configured to access information at a first size with a memory controller configured to operate on access of the information from an intermediate buffer of a different size. In one exemplary implementation, a system and method coordinates responses from a MRAM component configured to access information in a word size and a DRAM controller configured to access information from an intermediate access at a page size. In one embodiment, a coordination component coordinates and schedules access to information to compensate for the access size difference. In one embodiment, a system and method coordinates responses from a MRAM component configured to access information in a word size from an array of addressable memory cells and forward the results to a DRAM controller in compliance with bandwidth requirements of the DRAM controller. In one exemplary implementation, the results are forwarded to DRAM controller that is DDR compatible.

Figure 1:
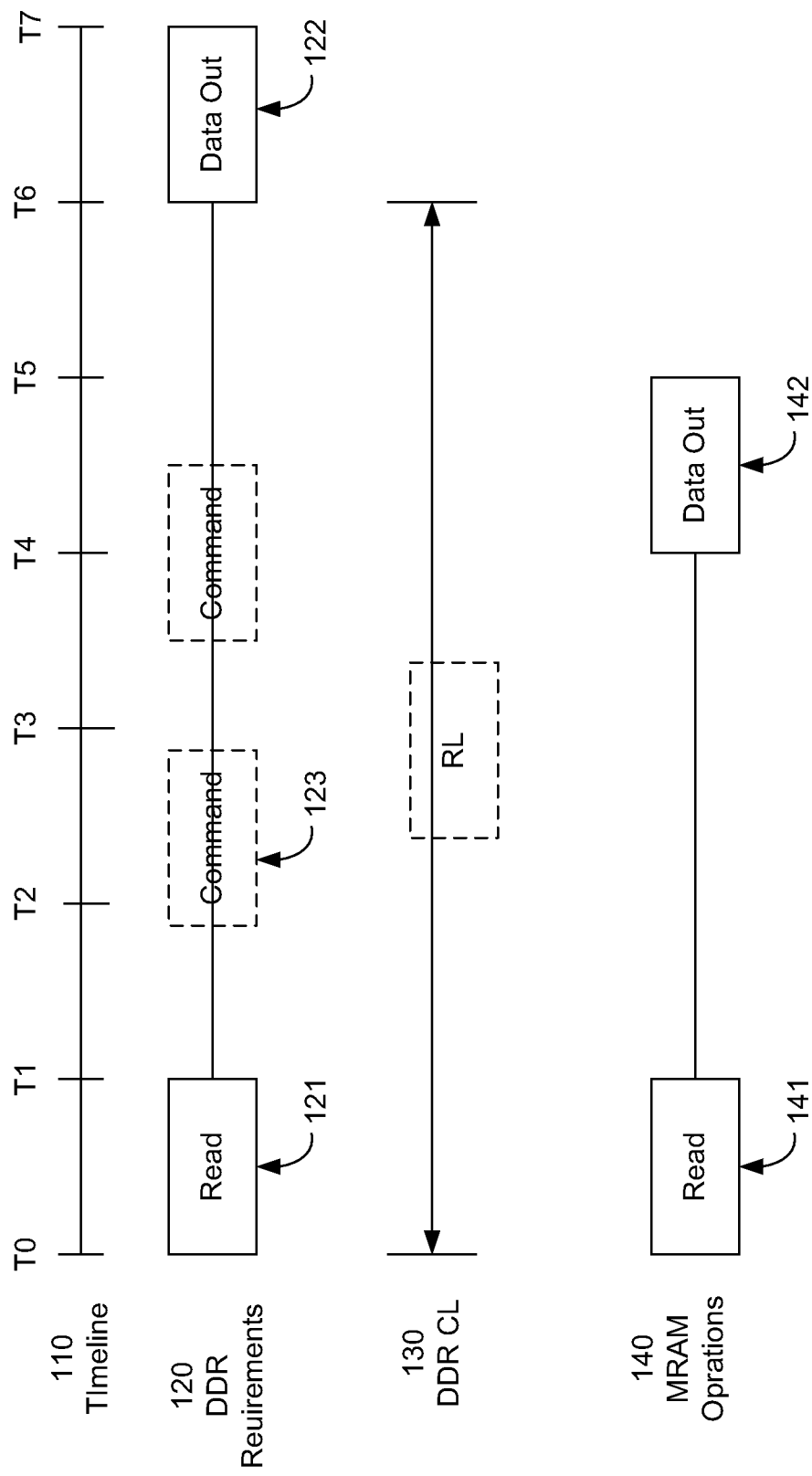
FIG. 1 is a block diagram of an exemplary of a MRAM coordinated operations in accordance with one embodiment.

FIG. 1 is a block diagram of an exemplary of a MRAM coordinated operations in accordance with one embodiment. A read access request 121 is sent from a DDR controller at time T0 with DDR timing requirements 120 that data out 122 response data start being received by the DDR controller by time T6. In one embodiment, there can be intermediate commands 123 from the DDR controller. The time from T0 to T6 is considered the DDR RL time 130. The read access request 121 is coordinated or reconfigured to correspond to a read access request 141 to the MRAM and MRAM read access operations 140 to retrieve data out 142 by time T6. It is appreciated the data out 142 can be a portion or all of the data corresponding to data out 122.

Figure 2:
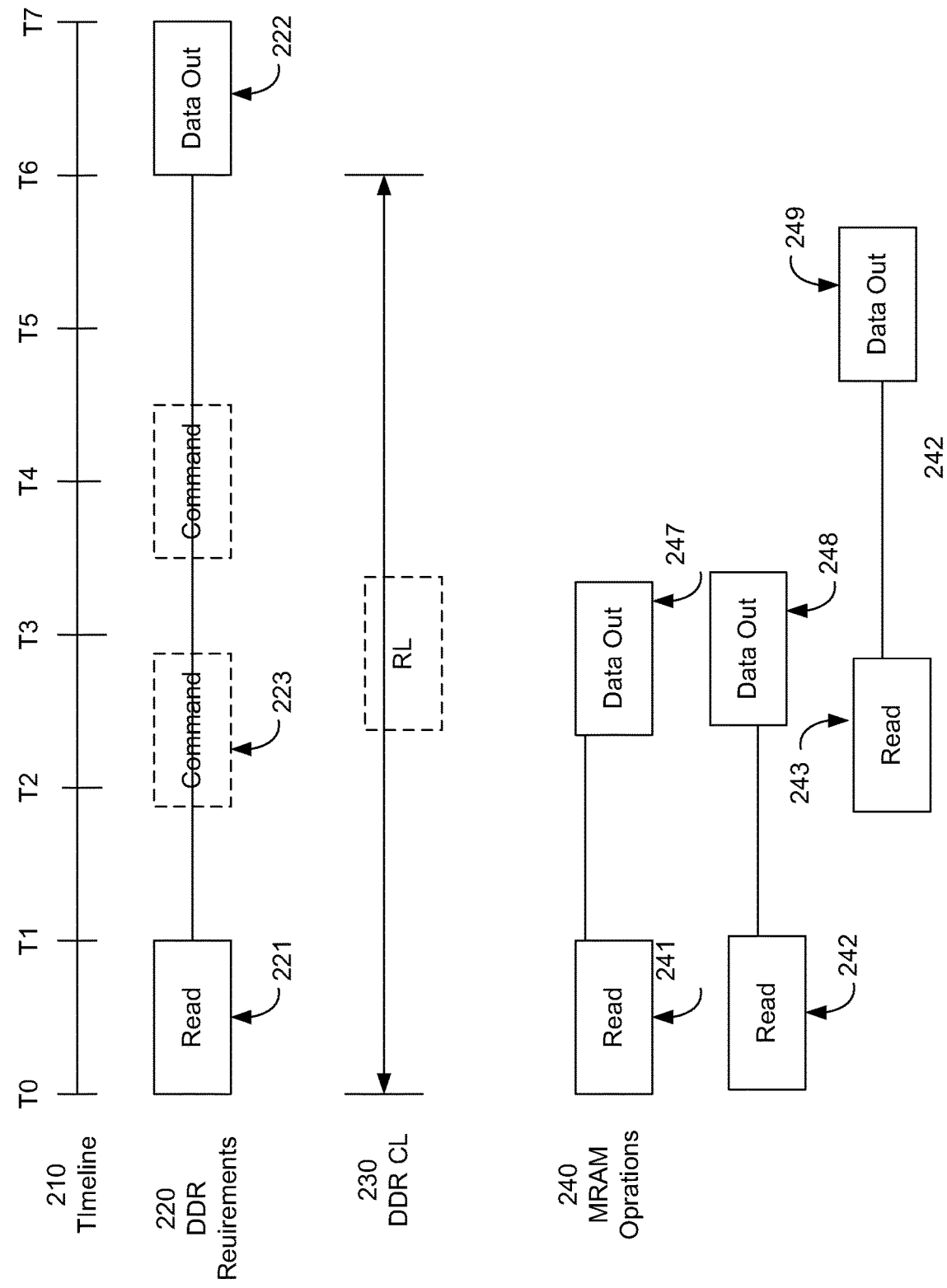
FIG. 2 is a block diagram of an exemplary of a MRAM coordinated operations in accordance with one embodiment.

In one embodiment, parallel MRAM accesses are made corresponding to a DDR access request. FIG. 2 is a block diagram of an exemplary of a MRAM coordinated operations in accordance with one embodiment. A read access request 221 is sent from a DDR controller at time T0 with DDR timing requirements 220 that data out 222 response data start being received by the DDR controller by time T6. In one embodiment, there can be intermediate commands 223 from the DDR controller. The time from T0 to T6 is considered the DDR RL time 230. In one embodiment, read activation latency (RL) equals Column Access Strobe Latency (CL) plus Address Latency (AL). The read access request 121 is coordinated or reconfigured to correspond to read access requests 241, 242, and 243 to the MRAM and MRAM read access operations 240 to retrieve data out 247, 248, and 249 by time T6. It is appreciated the data out 247, 248 and 249 can be portions of the total data associated with data out 122.

Figure 3:
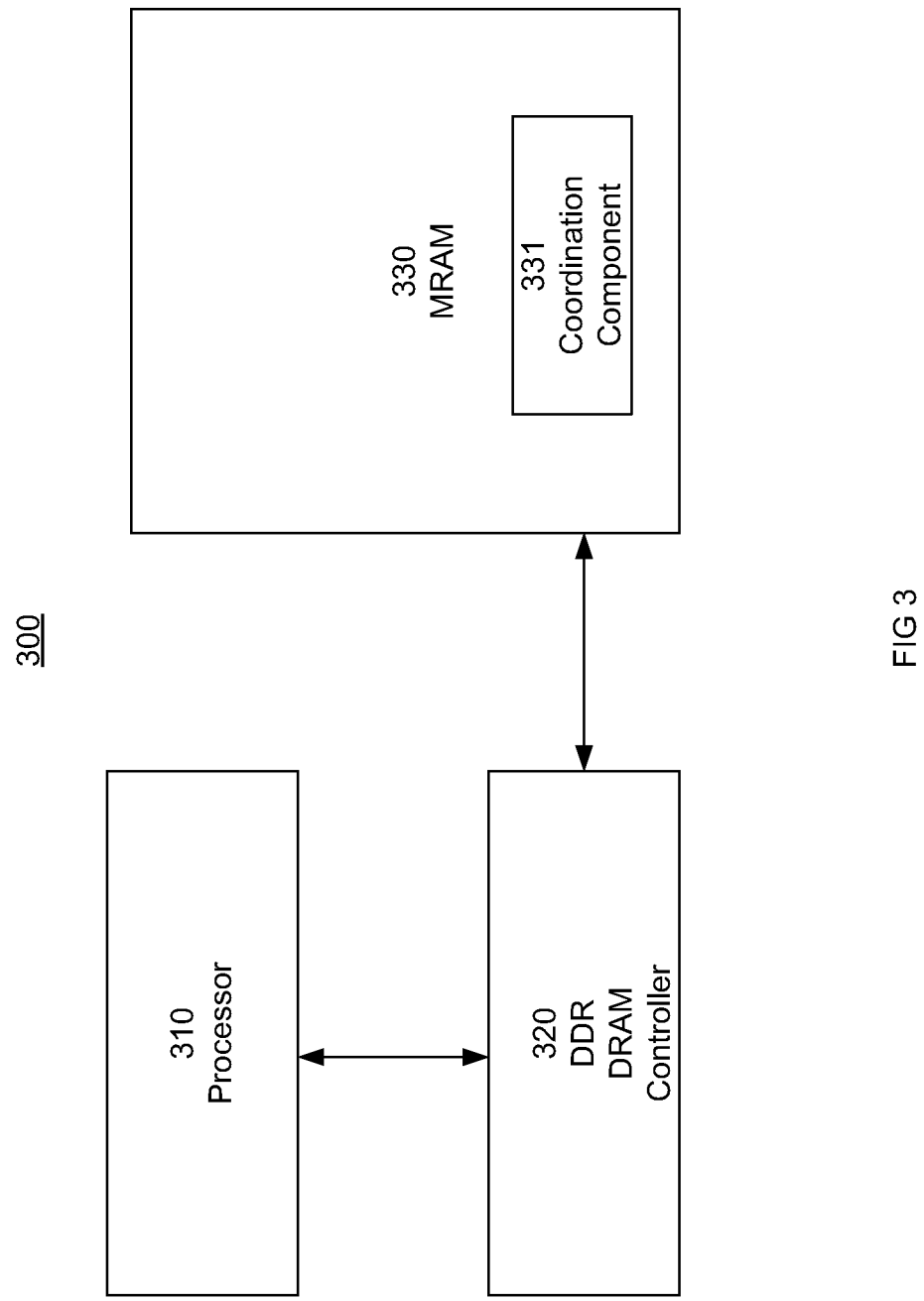
FIG. 3 is a block diagram of an exemplary computer system in accordance with one embodiment.

FIG. 3 is a block diagram of an exemplary computer system 300 in accordance with one embodiment. Computer system 300 includes processor 310, DDR DRAM controller 320 and MRAM 330. Processor 310 is configured to process information. MRAM 330 is configured to store information for processor 310. Processor 310 accesses MRAM 330 via DDR DRAM controller 320. MRAM 330 includes coordination component 331 to coordinate access requests from DDR DRAM controller 320 to storage locations MRAM 330. In one embodiment, coordination component 331 compensates for differences in MRAM 330 operating characteristics and DDR DRAM controller 320 access requirements. In one exemplary implementation, coordination component 331 directs access to information in MRAM 330 in a manner that complies with DDR DRAM controller 320 read activation latency (RL) timing requirements.

Figure 4:
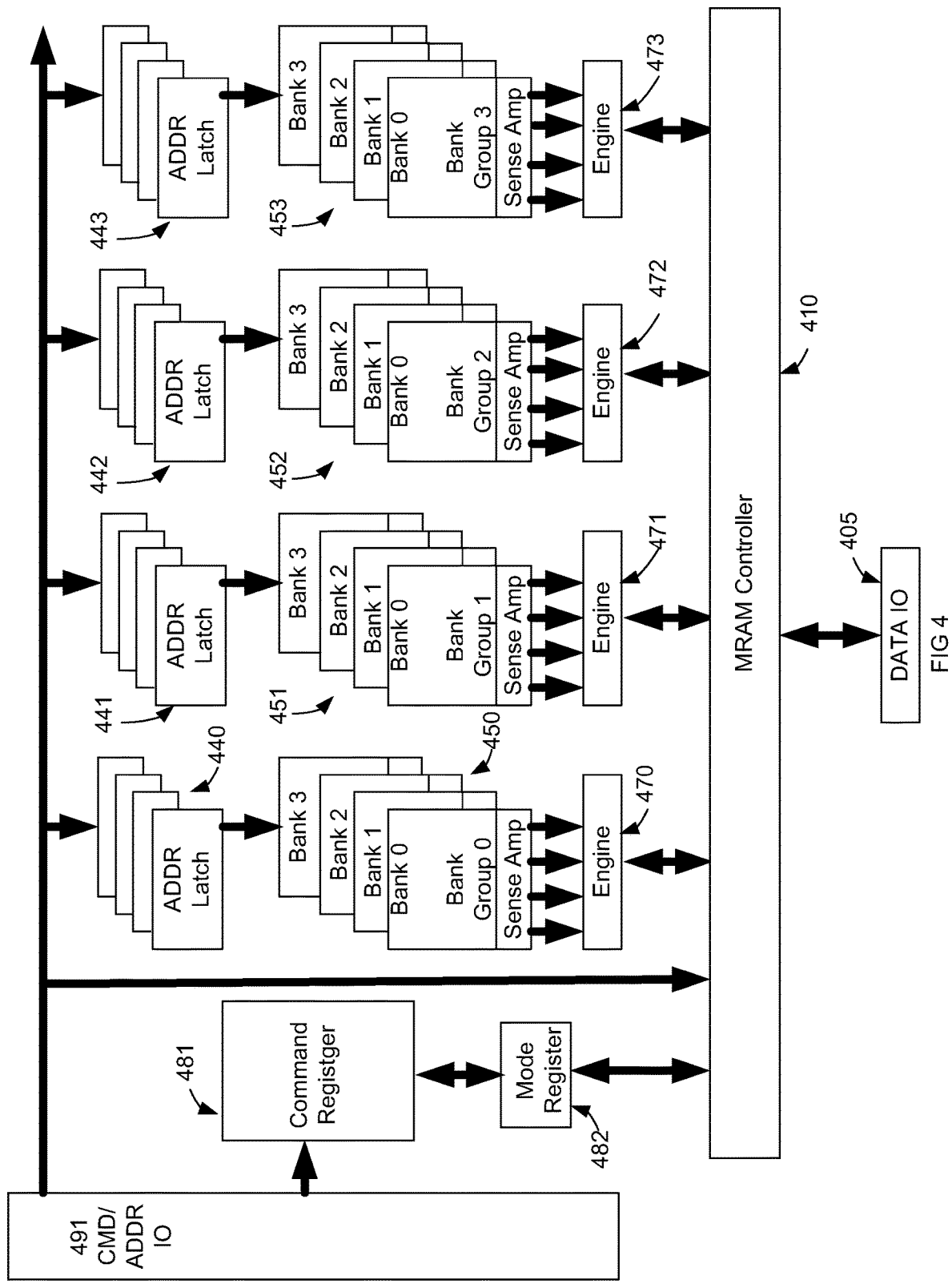
FIG. 4 is a block diagram of an exemplary MRAM in accordance with one embodiment.

FIG. 4 is a block diagram of an exemplary MRAM 400 in accordance with one embodiment. MRAM 400 includes memory bank group 450, 451, 452, and 453, corresponding address latch sets 440, 441, 442 and 443. corresponding engine 470, 471, 472 and 473, controller 410, command register 481, mode register 482, and command/address input/output (CDM/ADDR IO) 490. In one embodiment, corresponding engine 470, 471, 472 and 473, include a coordinator or scheduler configured to coordinate or schedule access requests for data IO 405 from a different type of memory controller. In one exemplary implementation, engines 470, 471, 472 and 473 include respective error buffers operable to store write operations requiring a rewrite operation for storage into the array. In one embodiment the different type of memory controller is a DDR DRAM controller. In one embodiment, engines 470, 471, 472 and 473 can service the respective memory banks in substantially parallel operations.

In one embodiment, a page buffer is not used and memory is treated as if it were an SRAM. There can be a No OP Activate/Page Open. Unlike a DRAM that performs a page read and loads an entire page into a page buffer, the MRAM approach can be a no-op. In one exemplary implementation, no power consumed in this phase compared to a conventional DRAM. The MRAM accesses can meet DDR Specification requires high bandwidth operation. In one embodiment, the MRAM can implement running concurrent word operations to facilitate meeting DDR Specification requirements. In one embodiment, an activate page command is not required and a No Op can be implemented in its place. In one embodiment, a MRAM controller can perform other operations during this time.

Figure 5:
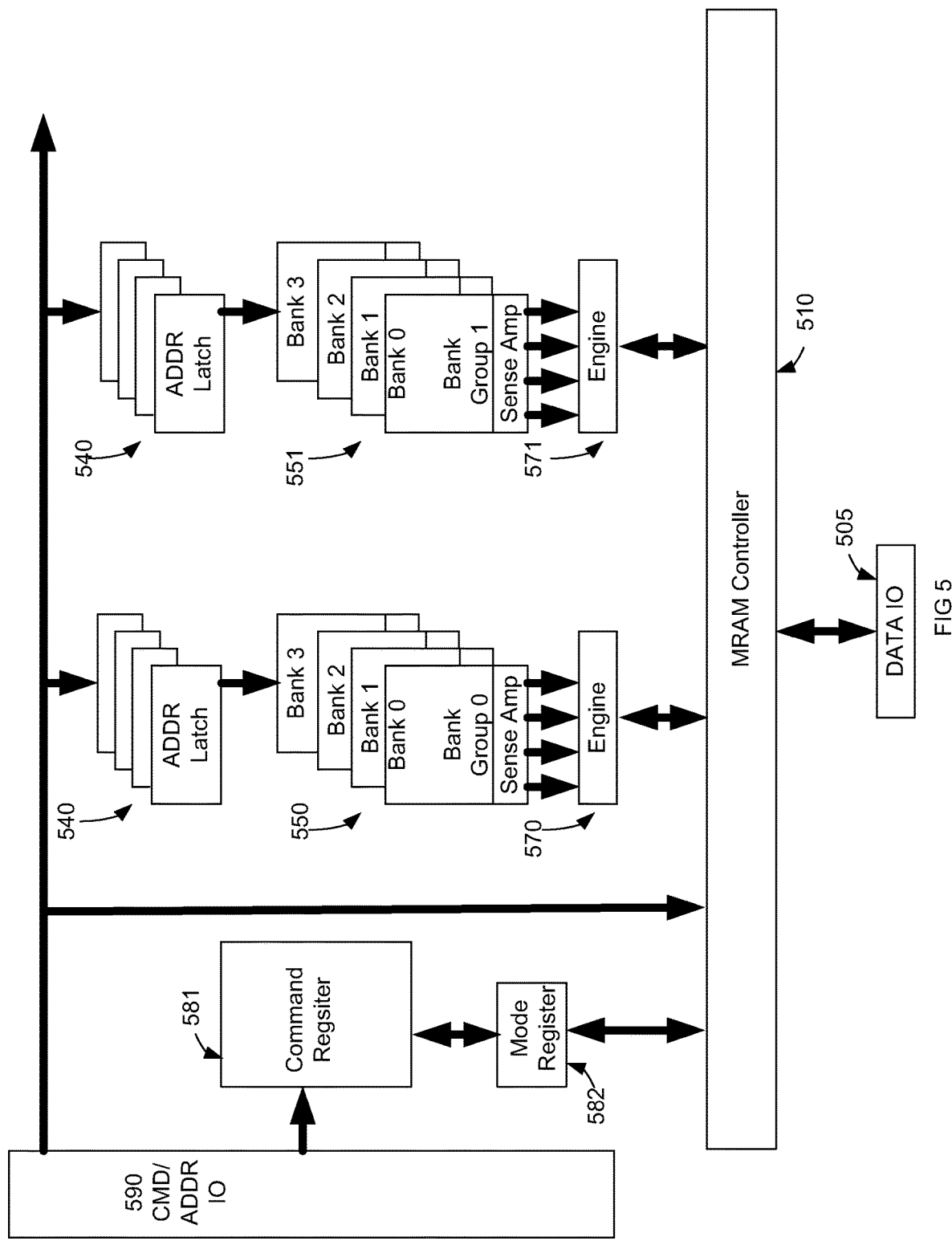
FIG. 5 is a block diagram of another exemplary MRAM configuration in accordance with one embodiment.

In one embodiment, information is read out directly from MRAM during a burst output. Typical DDR specification allows for around 12-15 nanosecond (ns) access delay between sending column address to delivering data. The MRAM approach reads directly from the MRAM array and sends output within the 12-15 ns window. In one embodiment, a size of a burst is equal to a size of an MRAM read. In one exemplary implementation, a MRAM read is 4 by 8 bits and a corresponding burst is 4 bytes. In one exemplary implementation, the MRAM approach allows memory to be Word Addressable. Since the MRAM does not require activates, rows can be switched out easily without requiring an activate operation. The MRAM approach removes this limitation that is otherwise required for a DRAM. In one embodiment, if additional timing for a read operation is required additional Address latency (AL) is added to the present duration FIG. 5 is a block diagram of an exemplary MRAM 500 in accordance with one embodiment. MRAM 500 includes memory bank group 550 and 551, corresponding address latch sets 540 and 541, corresponding engine 570 and 572, controller 510, command register 581, mode register 582, and command/address input/output (CDM/ADDR IO) 590. In one embodiment, engines 570 and 572 include a plurality of pipelines operable to access respective memory banks in memory bank groups 550 and 551. In one exemplary implementation, engines 570 and 572 include a coordination component or scheduler configured to coordinate and schedule access requests amongst the plurality pipelines for data IO 505 from a different type of memory controller. In one embodiment the different type of memory controller is a DDR DRAM controller.

It is appreciated the systems and methods can be implemented in various architectures. In one embodiment, the system of FIG. 4 is a (x8) architecture. In one embodiment, the system of FIG. 5 is a (x16) architecture. In one embodiment, the system of is (x4) architecture.

It is appreciated the systems and methods can be configured with an engine serving different sizes or portions of memory. A system and method can be configured with one engine per bank, one engine per bank group, one engine per chip, and so on. There can be multiple pipelines per different sizes or portions of memory. In one embodiment, there are multiple pipelines per memory bank. In one embodiment, a pipeline can operate or run at a different speed than a component of a memory array. In one embodiment, the number of pipelines in an engine configuration is based upon accommodating differences in a memory controller requirements and a memory array capabilities. In one exemplary implementation, the number of pipelines in an engine configuration is selected to enable compatibility between requirements of a memory controller and capabilities of a memory array. The number of pipelines can be configured to meet a bandwidth requirement of a memory controller balanced against operational characteristic of the memory array. The number of pipelines can be configured to meet a bandwidth requirement of a memory controller balanced against operational characteristic of the memory array. In one embodiment, the number of pipelines is selected to meet a bandwidth requirement of a memory controller DDR DRAM balanced against operational speed of a MRAM array.

Figure 6:
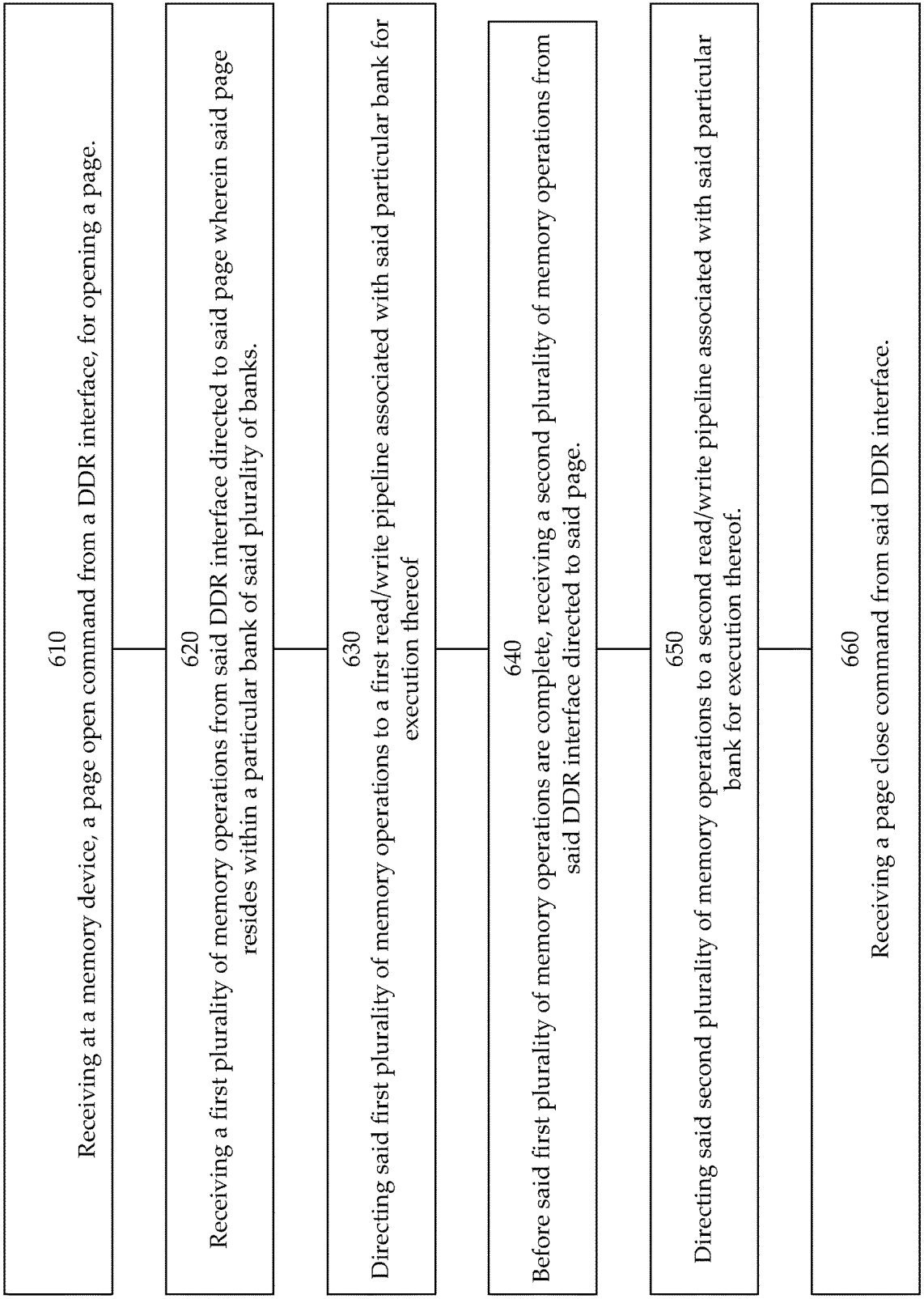
FIG. 6 is a flow chart of a MRAM access coordination method in accordance with one embodiment.

FIG. 6 is a flow chart of a MRAM access coordination method 600 in accordance with one embodiment. In one embodiment, a burst word is read from the magnetic random access memory (MRAM) cells during time allotted by the DDR interface requirements to respond to a page activate command. In one exemplary implementation, a plurality of burst words corresponding to a bus with are read from the magnetic random access memory (MRAM) cells during time allotted by the DDR interface requirements to respond to a page activate command.

In block 610 a page open command for opening a page is received from a DDR interface. The open command can be receiving at a memory device. In one embodiment the memory device comprises: an array of addressable magnetic random access memory (MRAM) cells organized into a plurality of banks; an error buffer operable to store write operations requiring a rewrite operation for storage into the array; a plurality of read/write pipelines operable to process read and write operations for the array, wherein each bank of the plurality of banks has associated therewith at least two respective read/write pipelines of the plurality of read/write pipelines; and an engine operable to control at least two read/write pipelines of the plurality of read/write pipelines and for controlling operations concerning the error buffer.

In block 620 a first plurality of memory operations are received from the DDR interface directed to the page wherein the page resides within a particular bank of the plurality of banks.

In block 630, the first plurality of memory operations are directed to a first read/write pipeline associated with the particular bank for execution thereof.

In block 630, the first plurality of memory operations are directed to a first read/write pipeline associated with the particular bank for execution thereof.

In block 640, before the first plurality of memory operations are complete, receiving a second plurality of memory operations from the DDR interface directed to the page.

In block 640, before the first plurality of memory operations are complete, receiving a second plurality of memory operations from the DDR interface directed to the page.

In block 640, before the first plurality of memory operations are complete, receiving a second plurality of memory operations from the DDR interface directed to the page.

In block 650, the second plurality of memory operations are directed to a second read/write pipeline associated with the particular bank for execution thereof.

In block 660, a page close command is received from the DDR interface.

Figure 7:
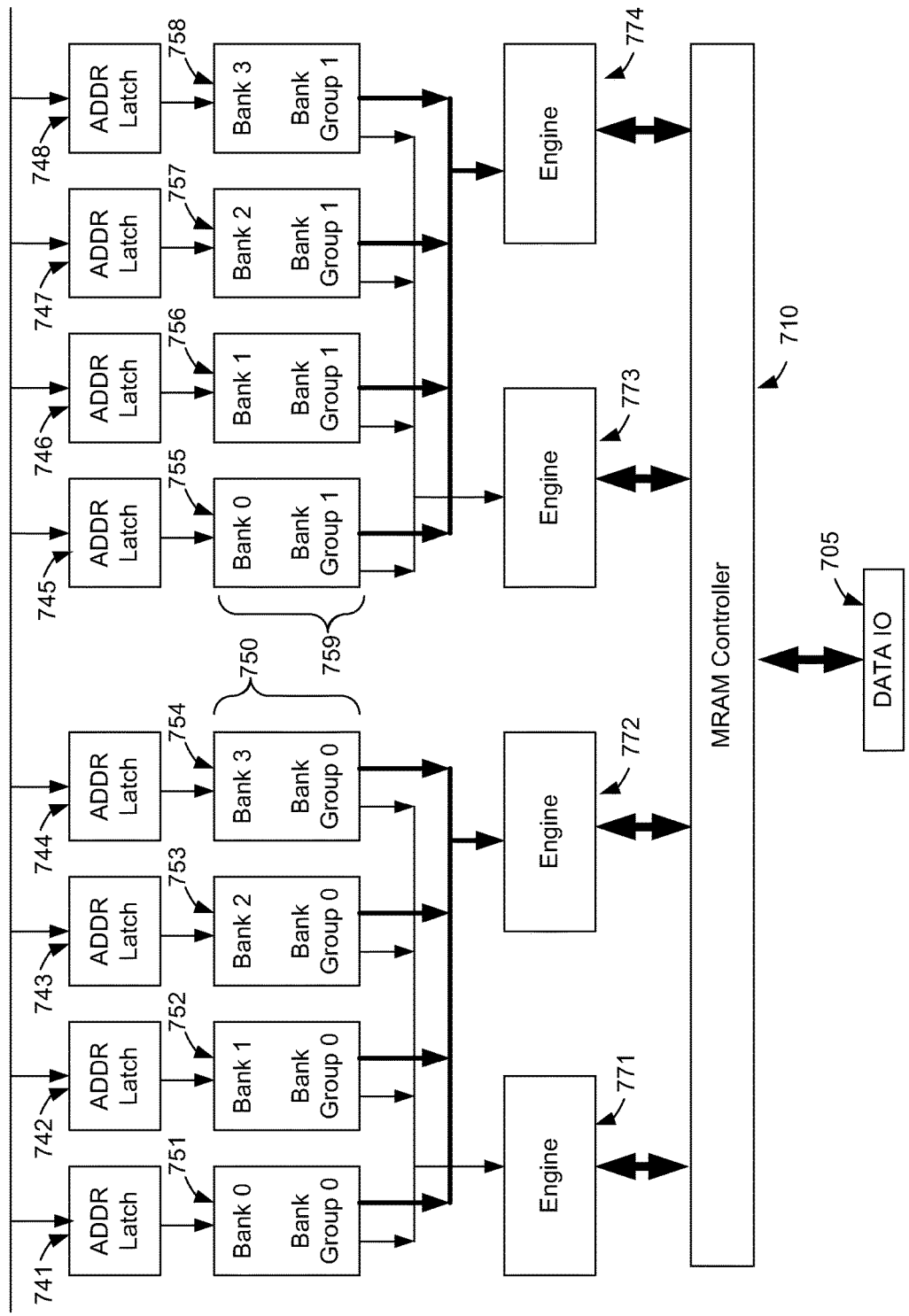
FIG. 7 is a block diagram of an exemplary a portion of an MRAM in accordance with one embodiment.

FIG. 7 is a block diagram of an exemplary a portion of MRAM 700 in accordance with one embodiment. MRAM 700 includes memory bank group 750 and 759. Memory bank group 750 includes memory banks 751, 752, 753, and 754. Memory bank group 751 includes memory banks 755, 756, 757, and 758. MRAM 700 includes address latches 741, 742, 743 and 744 (corresponding to memory banks 751, 752, 753, and 754) and address latches 745, 746, 747 and 748 (corresponding to memory banks 755, 756, 757, and 758). MRAM 700 also includes engines 771, 772, 773, and 774. Engine 771 can service memory banks 751, 752, 753, and 754. Similarly, engine 772 can service memory banks 771, 772, 773, and 774. In one embodiment, engines 771 and 772 can service the respective memory banks in substantially parallel operations. Engine 773 can service memory banks 755, 756, 757, and 758. Similarly, engine 772 can service memory banks 755, 756, 757, and 758. In one embodiment, engines 773 and 774 can service the respective memory banks in substantially parallel operations.

MRAM 700 also includes controller 710. In one embodiment, a coordinator (not shown) coordinates access requests for data IO 705 from a different type of memory controller. In one embodiment the different type of memory controller is a DDR DRAM controller.

In one embodiment, a DDR DRAM access request has an acceptable latency associated with a Column Access Strobe (CAS). In one embodiment, the Column Access Strobe Latency (CL) is similar to the read activation latency (RL).

In one embodiment, an engine includes multiple pipelines that cooperatively operate to access memory banks. In one exemplary implementation, at least a portion of operations associated with accessing a memory bank via a first pipeline are performed substantially concurrently or in parallel with at least a portion of operations associated with accessing a memory bank via second pipeline. In one embodiment, the pipelines are included in an engine that controls access to components of a memory array including memory banks of the memory array.

In one embodiment, the operations with accessing a memory bank via a pipeline are coordinated and configured to be compatible with an access requests from a memory controller. In one embodiment, the memory controller is configured to access a different type of memory than the memory array type. In one exemplary implementation, a memory controller is a DRAM type controller and the memory array is a MRAM memory array. The access operations to the memory via pipelines in an engine are coordinated to compensate for differences in the memory controller and the memory array. In one embodiment, at least a portion of operations associated with accessing a memory via a first pipeline are performed substantially concurrently or in parallel with at least a portion of operations associated with accessing a memory via second pipeline to compensate for difference in timing requirements of the memory controller and the timing capabilities of the memory array. In one exemplary implementation, the substantially concurrent or parallel pipelines operations enable a memory to meet the RL or CL timing requirements of various types of memory controllers.

Figure 8:
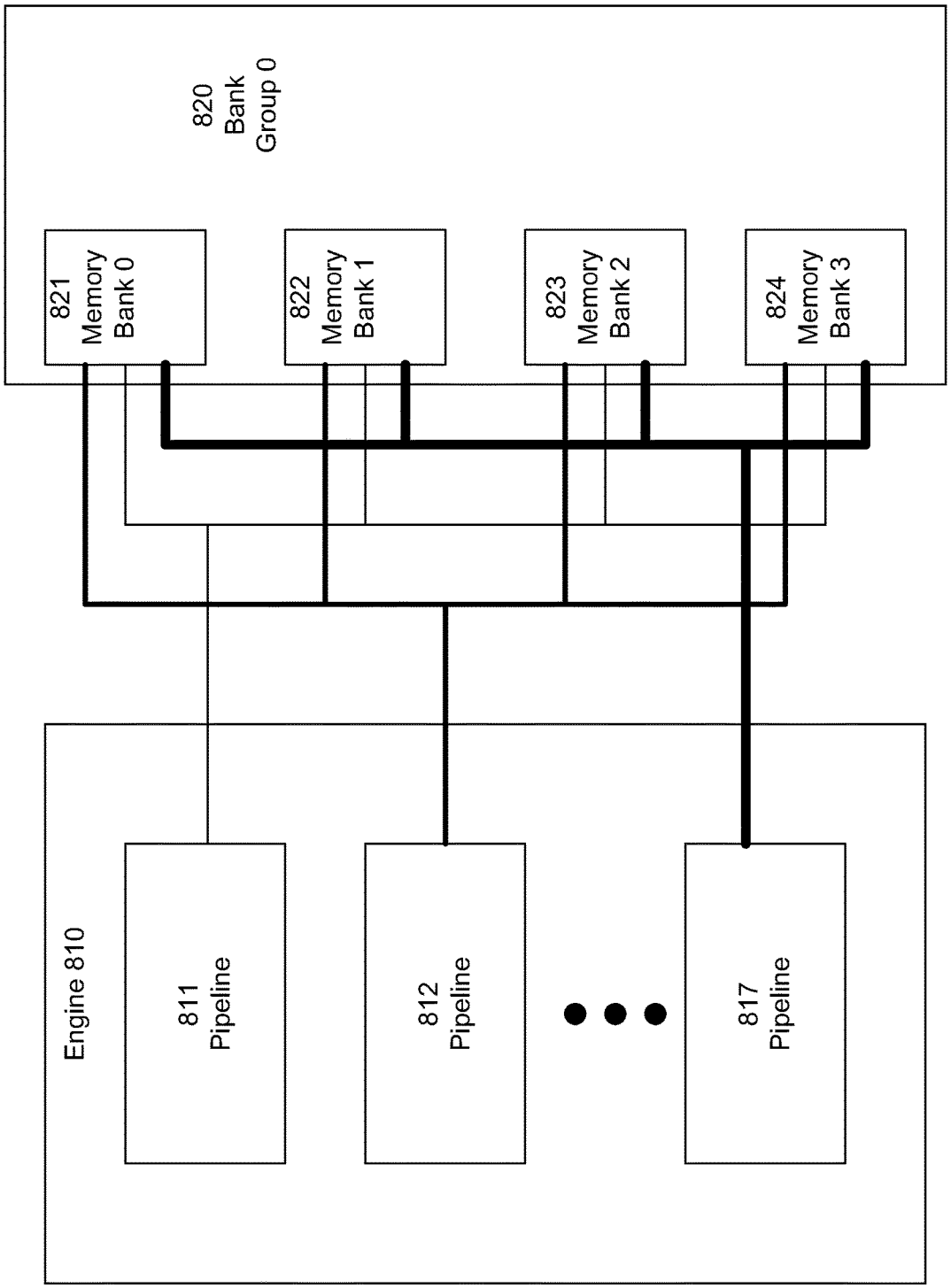
FIG. 8 is a block diagram of an exemplary first engine configuration in accordance with one embodiment.

FIG. 8 is a block diagram of an exemplary engine configuration in accordance with one embodiment. Engine 810 includes multiple pipelines (811, 812, 817, etc.). The engine 810 can access memory bank group 820 via the multiple pipelines (811, 812, 817, etc.). In one embodiment, engine 810 is similar to engines 470, 471, and 570, and memory bank group 820 is similar to memory bank groups 450, 451, and 550. Pipeline 811 is coupled to memory bank 821, 822, 823, and 824. Pipeline 821 is coupled to memory bank 821, 822, 823, and 824. Pipeline 817 is coupled to memory bank 821, 822, 823, and 824. In one embodiment, at least a portion of operations associated with accessing memory bank 821 via pipeline 811 are performed substantially concurrently or in parallel with at least a portion of operations associated with accessing memory bank 822 via pipeline 812. In one embodiment, at least a portion of operations associated with accessing memory bank 821 via pipeline 811 are performed substantially concurrently or in parallel with at least a portion of operations associated with accessing memory bank 821 via pipeline 812.

Figure 9:
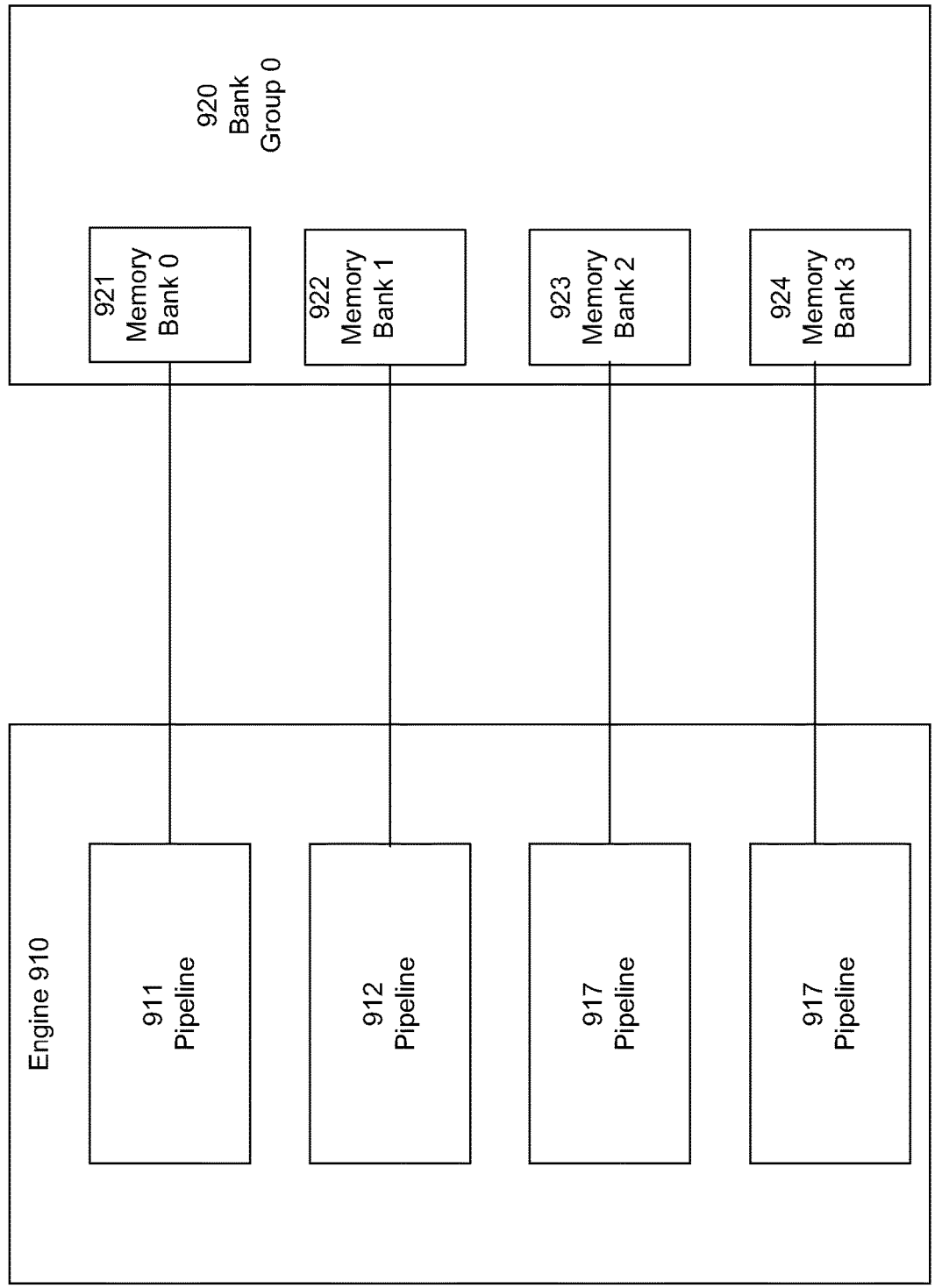
FIG. 9 is a block diagram of an exemplary second engine configuration in accordance with one embodiment.

FIG. 9 is a block diagram of an exemplary engine configuration in accordance with one embodiment. Engine 910 includes multiple pipelines (911, 912, 913, 914, etc.). The engine 910 can access memory bank group 820 via the multiple pipelines. In one embodiment, engine 910 is similar to engines 470, 471, and 570, and memory bank group 920 is similar to memory bank groups 450, 451, and 550. Pipeline 911 is coupled to memory bank 921. Pipeline 912 is coupled to memory bank 922. Pipeline 913 is coupled to memory bank 923. Pipeline 914 is coupled to memory bank 924. In one embodiment, at least a portion of operations associated with accessing memory bank 921 via pipeline 811 are performed substantially concurrently or in parallel with at least a portion of operations associated with accessing memory bank 922 via pipeline 912.

Figure 10:
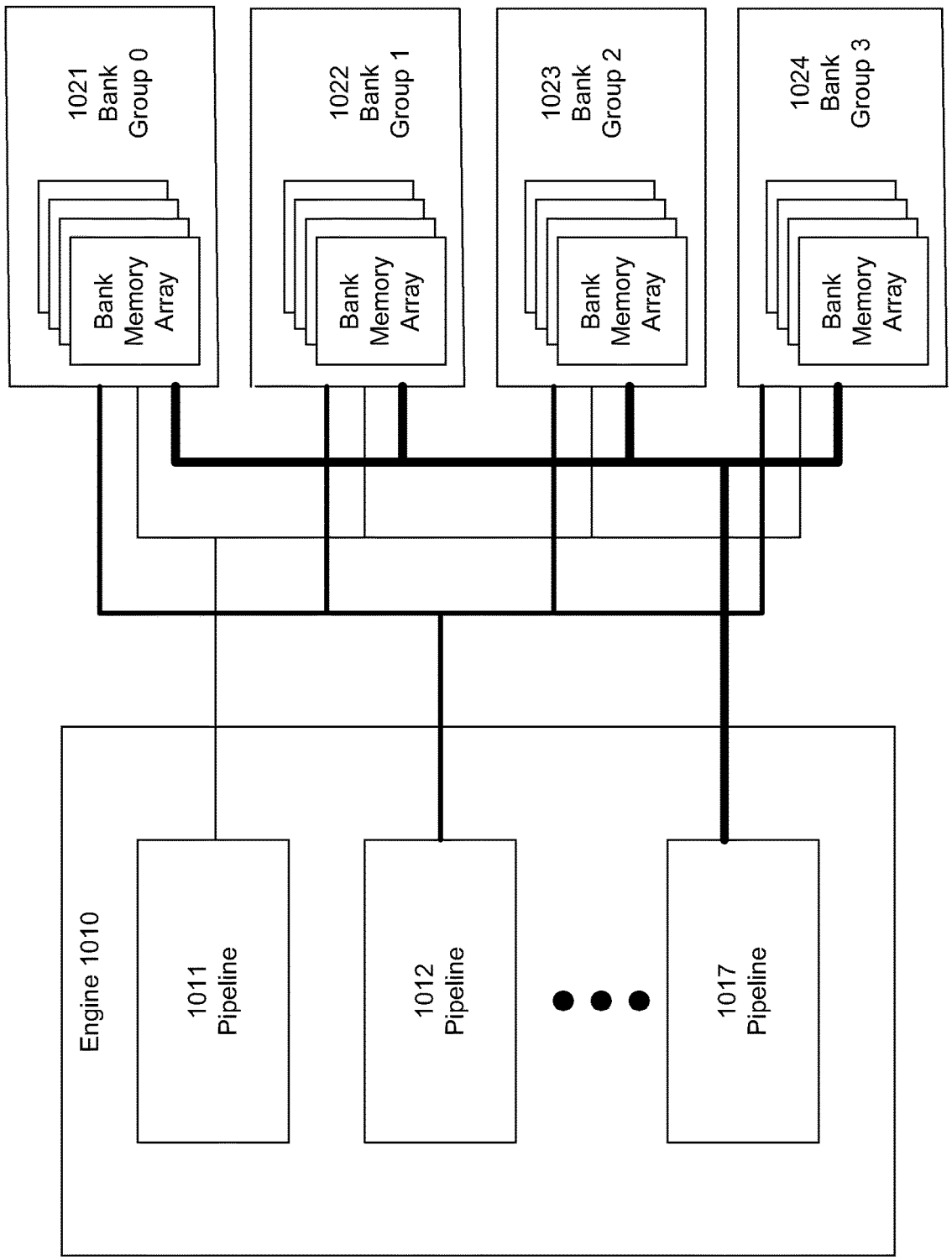
FIG. 10 is a block diagram of an exemplary third engine configuration in accordance with one embodiment.

In one embodiment, memory bank access operations can be coordinated across different memory bank groups. FIG. 10 is a block diagram of an exemplary engine configuration in accordance with one embodiment. Engine 1010 includes multiple pipelines (811, 812, 817, etc.). The engine 1010 can access multiple memory bank groups 1021, 1022, 1023, and 1024 via the multiple pipelines (1011, 1012, 1017, etc.). In one embodiment, engine 1010 is similar to engines 470, 471, and 570, and memory bank groups 1021, 1022, 1023, and 1024 are similar to memory bank groups 450, 451, and 550. Pipeline 1011 is coupled to memory bank groups 1021, 1022, 1023, and 1024. Pipeline 1021 is coupled to memory bank 1021, 1022, 823, and 1024. Pipeline 1017 is coupled to memory bank 1021, 1022, 1023, and 1024. In one embodiment, at least a portion of operations associated with accessing memory bank group 1021 via pipeline 1011 are performed substantially concurrently or in parallel with at least a portion of operations associated with accessing memory bank 1022 via pipeline 1012. In one embodiment, at least a portion of operations associated with accessing memory bank 1021 via pipeline 1011 are performed substantially concurrently or in parallel with at least a portion of operations associated with accessing memory bank 1021 via pipeline 1012.

Figure 11:
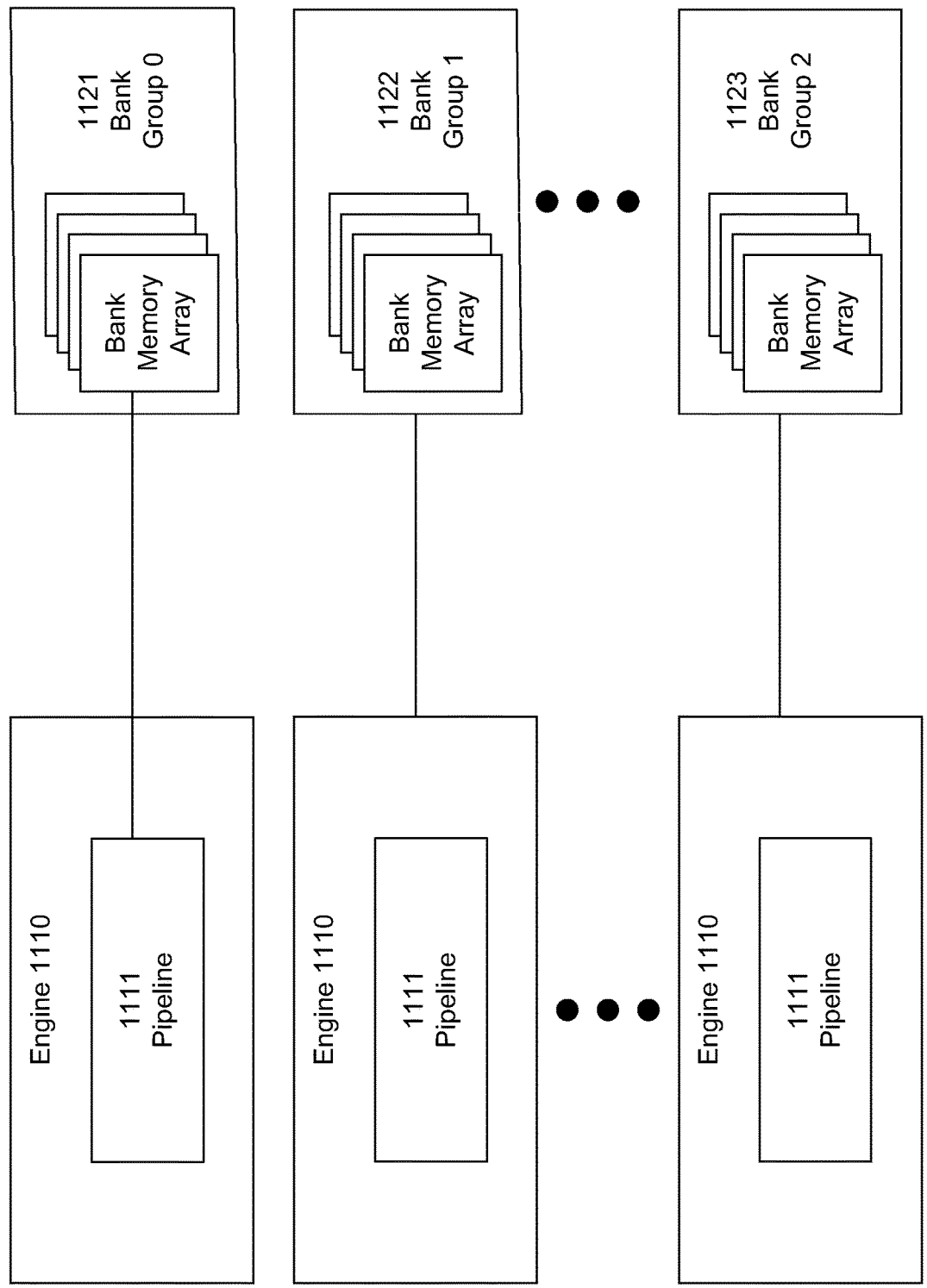
FIG. 11 is a block diagram of an exemplary fourth engine configuration in accordance with one embodiment.

FIG. 11 is a block diagram of an exemplary engine configuration in accordance with one embodiment. Engine 1110 includes multiple pipelines (1111, 1112,1113, etc.). The engine 1110 can access memory bank groups 1120, 1121, 1122, and 1123 via the multiple pipelines. In one embodiment, engine 1110 is similar to engines 1170, 1171, and 1170, and memory bank group 1120 is similar to memory bank groups 1150, 1151, and 1150. Pipeline 1111 is coupled to memory bank group 1121. Pipeline 1112 is coupled to memory bank group 1122. Pipeline 1113 is coupled to memory bank group 1123. Pipeline 1114 is coupled to memory bank group 1124. In one embodiment, at least a portion of operations associated with accessing memory bank group 1121 via pipeline 1111 are performed substantially concurrently or in parallel with at least a portion of operations associated with accessing memory bank group 1122 via pipeline 1112.

In one embodiment, memory access operations can be coordinated amongst pipelines in difference engines. In one exemplary implementation, a memory access operation directed to a location in memory bank 0 of group 450 (in FIG. 4) via a pipeline in engine 470 can be coordinated with a memory access operation directed to a location in memory bank 3 of group 451 via a pipeline in engine 471. In one exemplary implementation, a memory access operation directed to a location in memory bank 0 of group 450 (in FIG. 4) via a pipeline in engine 470 can be coordinated with a memory access operation directed to a location in memory bank 1 of group 450 via a pipeline in engine 471. The coordination can be configured to enable operation constraints of the memory banks (e.g., memory bank 0 of group 450, memory bank 3 of group 451, etc.) to meet and be operational requirements of a memory controller. In one embodiment, the memory banks (e.g., memory bank 0 of group 450, memory bank 3 of group 451, etc.) include MRAM components and the memory controller is a DRAM controller.

Figure 12:
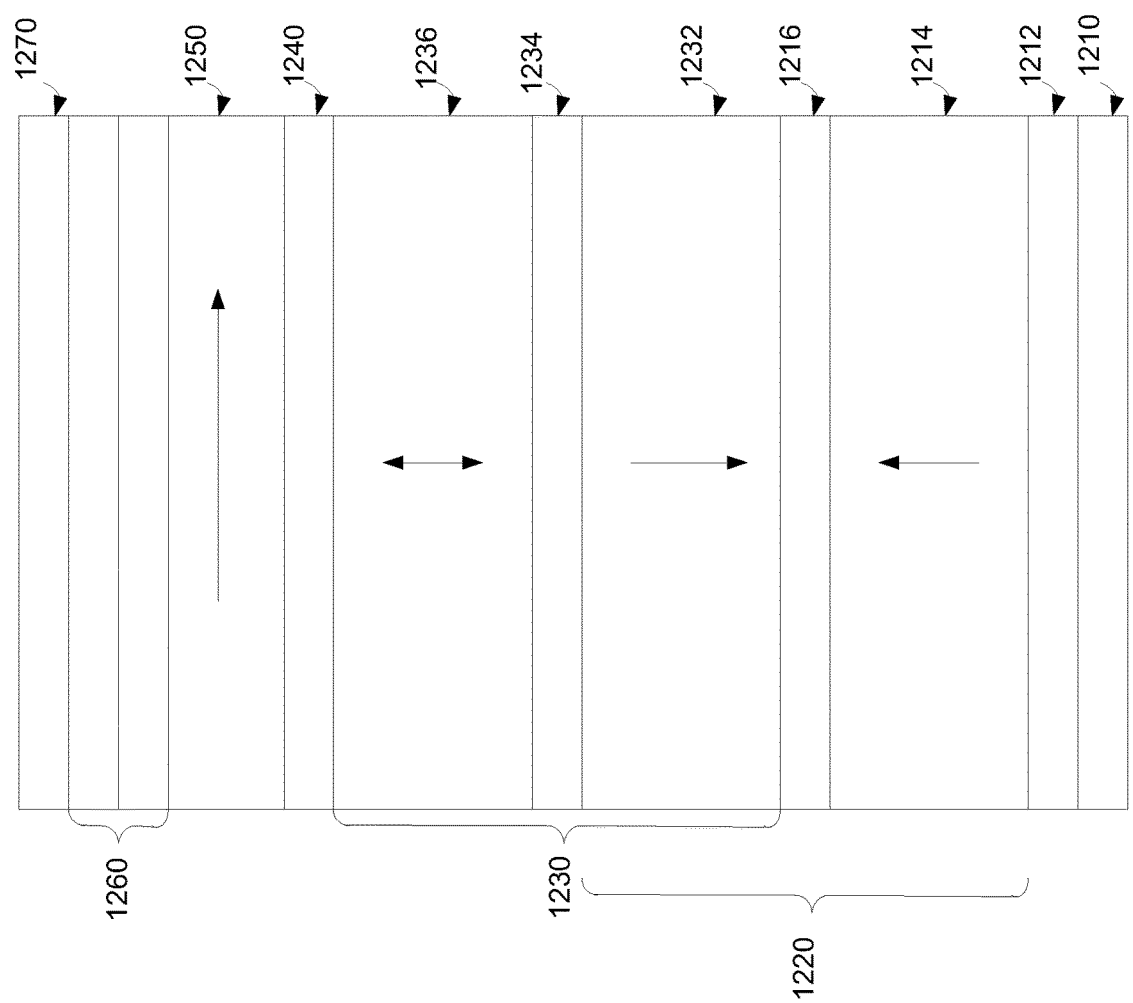
FIG. 12 illustrates an exemplary magnetic tunnel junction ("MTJ") in accordance with one embodiment.

In one embodiment a magnetoresistive random-access memory (MRAM) includes a magnetic tunnel junction ("MTJ"). The MTJs can have various configurations. In one exemplary implementation, the MTJs can be configured as pillar MTJSs (pMTJs). The pMTJ can be considered a 3D MTJ structure. FIG. 12 illustrates a magnetic tunnel junction ("MTJ") 1200 in accordance with one embodiment. MTJ 1200 includes one or more seed layers 1210 provided at the bottom of stack 1200 to initiate a desired crystalline growth in the above-deposited layers. An antiferromagnetic layer 1212 is disposed over seed layers 1210. MTJ 1230 is deposited on top of synthetic antiferromagnetic (SAF) layer 1220. MTJ 1230 includes reference layer 1232, which is a magnetic layer, a non-magnetic tunneling barrier layer (i.e., the insulator) 1234, and the free layer 1236, which is also a magnetic layer. It should be understood that reference layer 1232 can actually be part of SAF layer 1220, but forms one of the ferromagnetic plates of MTJ 1230 when the non-magnetic tunneling barrier layer 1234 and free layer 1236 are formed on reference layer 1232. As shown in FIG. 12, magnetic reference layer 1232 has a magnetization direction perpendicular to its plane. As also illustrated in FIG. 12, free layer 1236 also has a magnetization direction perpendicular to its plane, but its direction can vary by 1120 degrees.

The first magnetic layer 1214 is disposed over seed layer 1210. SAF layer 1220 also has an antiferromagnetic coupling layer 1216 disposed over the first magnetic layer 1214. Furthermore, a nonmagnetic spacer 1240 is disposed on top of MTJ 1230 and a polarizer 1250 is disposed on top of the nonmagnetic spacer 1240. Polarizer 1250 is a magnetic layer that has a magnetic direction that may be parallel to its plane and orthogonal to the magnetic direction of the reference layer 1232 and free layer 1236. Polarizer 1250 is provided to polarize a current of electrons ("spin-aligned electrons") applied to MTJ structure 1230. A capping layer 1260 can be provided on top of perpendicular polarizer 1250 to protect the layers below on MTJ stack 1200. Finally, a hard mask 1270 is deposited over capping layers 1260 and is provided to pattern the underlying layers of the MTJ structure 1200, using a reactive ion etch (RIE) and ion beam etch processes. In one embodiment, the MTJ structure is similar to portions of a pMTJ.

Figure 13:
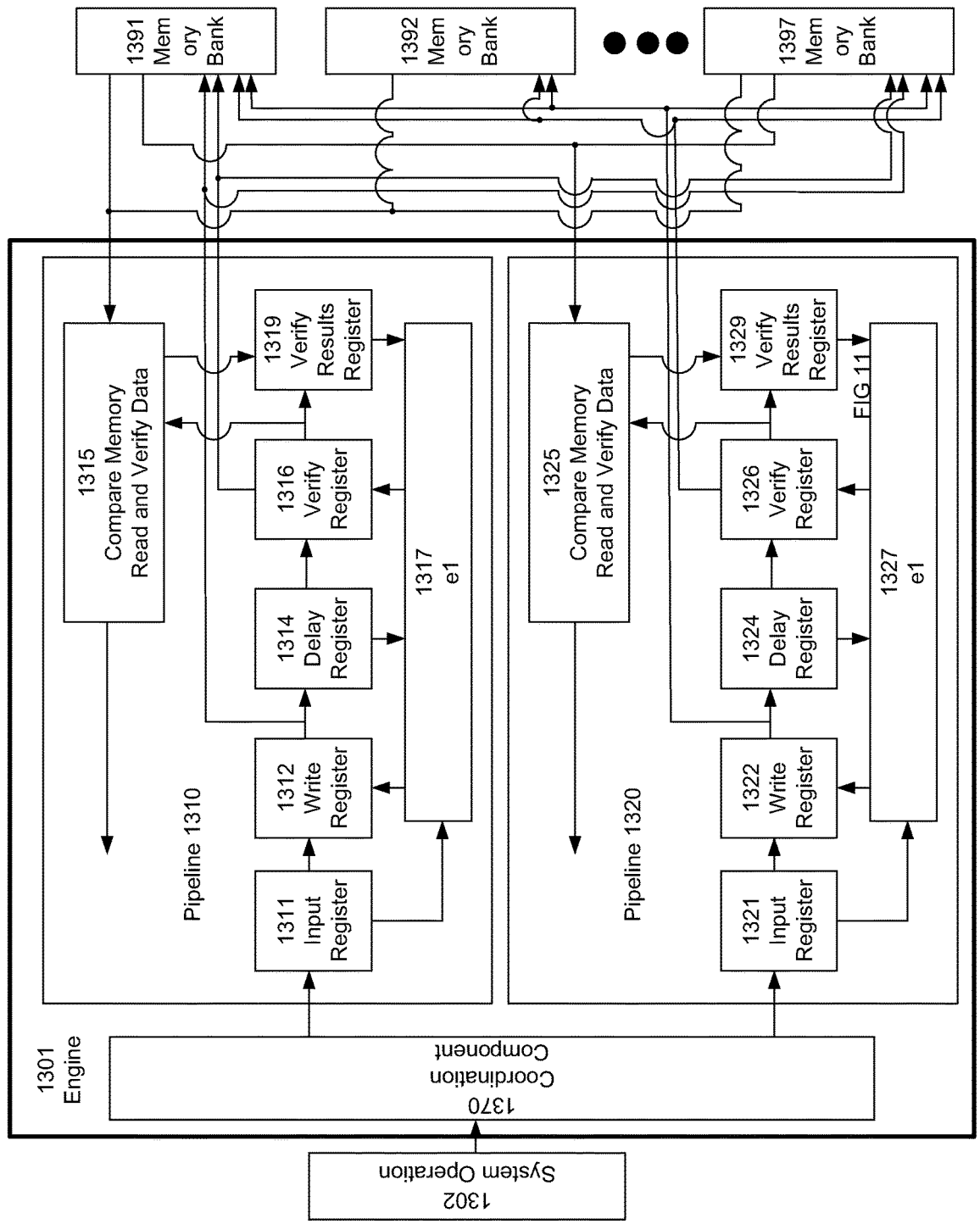
FIG. 13 is a block diagram of exemplary embodiment of an exemplary engine with multiple pipelines in accordance with one embodiment.

FIG. 13 is a block diagram of exemplary embodiment of exemplary engine 1301 with multiple pipelines in accordance with one embodiment. Engine 1301 includes coordination component 1370 and pipelines 1310 and 1320. Pipelines 1310 and 1320 can implement a pipeline flow for system write, re-write, and verify operations, among other data manipulation operations. Pipeline 1310 includes input register 1311, write register 1312, delay register 1314, verify register 1316, verify results register 1319, and e-buffer (e1) 1317. In one exemplary implementation, pipeline 1310 also comprises compare memory logic 1350. Pipeline 1320 includes input register 1321, write register 1322, delay register 1324, verify register 1326, verify results register 1329, and e-buffer (e1) 1327. In one exemplary implementation, pipeline 1320 also comprises compare memory logic 1320. Engine 1301 is coupled to memory banks (e.g., 1391, 1392, 1397, etc.). Engine 1301 is configured to receive system operations 1302. In one embodiment, engine 1301 receives system operations from a memory controller (e.g., DRAM controller, DDR controller, etc.).

System operations 1302 comprises signals for performing a desired operation such as system write, system read, and other data manipulation operations. As such, system operations 1302 typically include signals indicating a data word, the associated data address within a memory bank (1391, 1392, 1397, etc.) and control signals indicating the operation to be performed on the memory bank (such as write or chip select signal), among other signals for performing data manipulation operations and maintaining appropriate states.

The system operation 1302 information is forwarded to coordination component 1370. In one embodiment, coordination component 1370 coordinates access to pipelines. Coordination component 1370 decides which pipeline 1310 or 1320 to forward the system operation information to. In one exemplary implementation, coordination component 1370 schedules information flow to a pipeline. In one embodiment, if an operation is currently being processed by a pipeline, the coordination component forwards newly arriving or other pending operation information to the other pipeline. In one exemplary implementation, if a system operation is currently being processed by pipeline 1310, the coordination component 1370 forwards newly arriving system operation information to the other pipeline 1320. It is appreciated that pipelines 1310 and 1320 can process at least a portion of the system operation in parallel at substantially the same time. In one embodiment, coordination component 1370 ensures that pipeline 1310 and 1320 do try to access the same memory bank at substantially the same time. In one exemplary implementation, if memory bank 1391 is currently involved in system operations from pipeline 1310, coordination component 1370 ensures that pipeline 1320 does not access memory bank 1391 at substantially the same time.

Typically, the information from system operations 1302 is stored in input registers 1311 and 1321. Input registers 1311 and 1321 are coupled to write registers 1312 and 1322 respectively. In one embodiment where a pseudo-dual bank memory bank is used, the input registers 1311 and 1322 can add a delay in the respective pipelines 1310 and 1320 that allows the memory device time to search for a data word and an associated address in the e1 register respective 1317 and 1327 that shares a common row address with a data word (associated with a write operation) in the input register. If a pseudo-dual port memory bank is used, an e1 register may choose a data word and an associated address such that they share a common row address with a data word to be written into the write register of the pipeline structure. In this way, a write operation and a verify operation can be simultaneously performed at least in part since the data words share a common row address. In other words, the delay of the respective input registers allows enough time to search for the matching verify operation in the e1 register prior to inserting the data words to be written and verified into the respective write register (1312 and 1322) and the respective verify registers (1316 and 1326). In one embodiment, a valid bit indicates whether data manipulation operations such as system write operation should be performed or the register should not be used to perform such operations.

In one embodiment, an active memory bank of an embodiment of the present disclosure denotes a memory bank in which a system write or system read is taking place. Thus, an active bank signal (or an active bank bit) prevents re-writes during that clock cycle, and instead indicates that a system write or read will occur during that clock cycle. For example, an active bank signal indicates that a write register will write a data word previously received from an input register to a memory bank (e.g., 1391, 1392, 1397, etc.) during that clock cycle. Thus, e1 register knows that data word for re-write operation should not be transmitted to write register during that clock cycle. Input registers 1311 and 1321 transmits data word, associated address, and desired control bits to respective write registers 1312 and 1322.

The e1 register 1317 is coupled to input register 1311, write register 1312, delay register 1314, verify register 1316, and verify results register 1319. The e1 register 1327 is coupled to input register 1321, write register 1322, delay register 1324, verify register 1326, and verify results register 1329. The e1 registers may supply data word, associated address of a data word within a memory bank (e.g., 1391, 1392, 1397, etc.) and control signals to respective write registers, and verify registers. The e1 registers may receive a data word, its associated address, and control signals from respective delay registers and verify results registers. The e1 registers may also transmit a physical address within the respective e1 registers in case the data word is already stored within the e1 register. Moreover, e1 registers may communicate with respective input registers to receive signals such as data word signal and control signal such as inactive bank signal.

Write register 1312 is coupled to delay register 1314 and memory banks (e.g., 1391, 1392, 1397, etc). Write register 1322 is coupled to delay register 1324 and memory banks (e.g., 1391, 1392, 1397, etc.). In one embodiment, a write register may be coupled to a respective verify register. For memory bank clock cycles that a write register would not otherwise be writing system data words to that memory bank, an e1 register transmits data words, associated address, and desired control bits to the write register. This allows a write register to attempt re-write operations when the write register would not otherwise be writing system data words to a memory bank (e.g., 1391, 1392, 1397, etc.). When a pseudo-dual port memory bank is used, a write register may perform write operation simultaneously at least in part with a verify operation performed by a verify register if the operations share a common row address.

Delay register 1314 is coupled to verify register 1316 and e1 register 1317. Delay register 1324 is coupled to verify register 1326 and e1 register 1317. The delay register or multiple delay registers can provide more clock cycle delay between write and verify. A data word may be verified on a later clock cycle when write register will write a data word sharing a common row address. In one embodiment, data word may be verified on a later clock cycle when no verify operation will otherwise occur to the memory bank.

Verify register 1316 is coupled to the memory banks (e.g., 1391, 1392, 1397, etc.) and verify results register 1320. Verify register 1326 is coupled to the memory banks (e.g., 1391, 1392, 1397, etc.) and verify results register 1320. A verify register may comprise internal e1 address if data word was received as a result of re-write operation or verify operation from e1 register. A verify register receives contents from a respective delay register if no row address change has occurred. A verify register receive contents from a respective e1 register if row address change occurred. A verify register transmits the associated address to a memory bank (e.g., 1391, 1392, 1397, etc.) for the data word to be verified. A verify register also transmits the data word, fail count bits, and other desired status bits to respective compare data logic. A verify register transmits the data word and its associated address to a respective verify results register in case of a system write. A verify register transmits an internal e1 address in case of re-write operation or verify from a respective e1 register.

Compare memory logic 1315 is coupled to verify register 1316. Compare memory logic 1325 is coupled to verify register 1326. Compare memory logic may comprise read or sense amplifiers to read a data word from the memory bank (e.g., 1391, 1392, 1397, etc.). In the case of verify operation, compare memory logic receives input from a respective verify register and memory bank.

A memory bank outputs a data word to compare memory logic based on the associated address transmitted from a verify register. Compare memory logic also receives the data word from a verify register. Thus, compare memory logic determines whether the write operation passed or failed. Compare memory logic makes the pass/fail determination based on methods desired by those with ordinary skill in the art. In one embodiment, compare memory logic determines whether the data word from a verify register matches the data word from a memory bank. In other embodiments, compare memory logic deems that the operation passed if a predetermined number of bits match. If verify operation passed, compare memory logic passes appropriate control bits to a verify results register, for example fail count bits may be set to 0. Verify results register may then invalidate the entry within e1 register if needed. If verify operation failed, verify results register updates fail count bits within e1 register (in case of re-write or verify from e1) or transmits the data word, the associated address, and control bits to e1 register (in case of system write).

In the case of read operation, a memory bank (e.g., 1391, 1392, 1397, etc.) outputs a data word, the associated address, and desired control bits to respective compare memory logic. The compare memory logic determines whether the read operation passed or whether re-write operation should be performed on a memory bank (e.g., 1391, 1392, 1397, etc.) because too many errors occurred while reading the data word. In one embodiment, compare memory logic corrects data words using ECC and parity bits associated with data words. If ECC determines that too many errors occurred (e.g., errors above a predetermined threshold), compare memory logic also transmits the data word and control bits to verify results register 518.

Verify results register 1319 is coupled to compare memory logic 1315 and e1 register 1317. Verify results register 1329 is coupled to compare memory logic 1325 and e1 register 1327. A valid bit indicates that contents of a verify results stage register are valid to be written to a respective e1 register. A verify results register may also comprise an internal e1 address.

One of ordinary skill in the art will understand that pipeline structures 1310 and 1320 are exemplary and may include more write, delay, verify, verify results registers, and compare logic blocks to allow more re-write attempts before writing failed data words to e1 register. Moreover, more registers and memory banks may be added without departing from the scope of the present disclosure.

It is appreciated there are various pipeline configurations. In one embodiment, engines and pipelines are similar to those described in co-pending patent application Ser. No. 16/275,088 entitled "A multi-Chip Module for MRAM Devices" filed on Feb. 13, 2019 is incorporated herein by reference.

Figure 14:
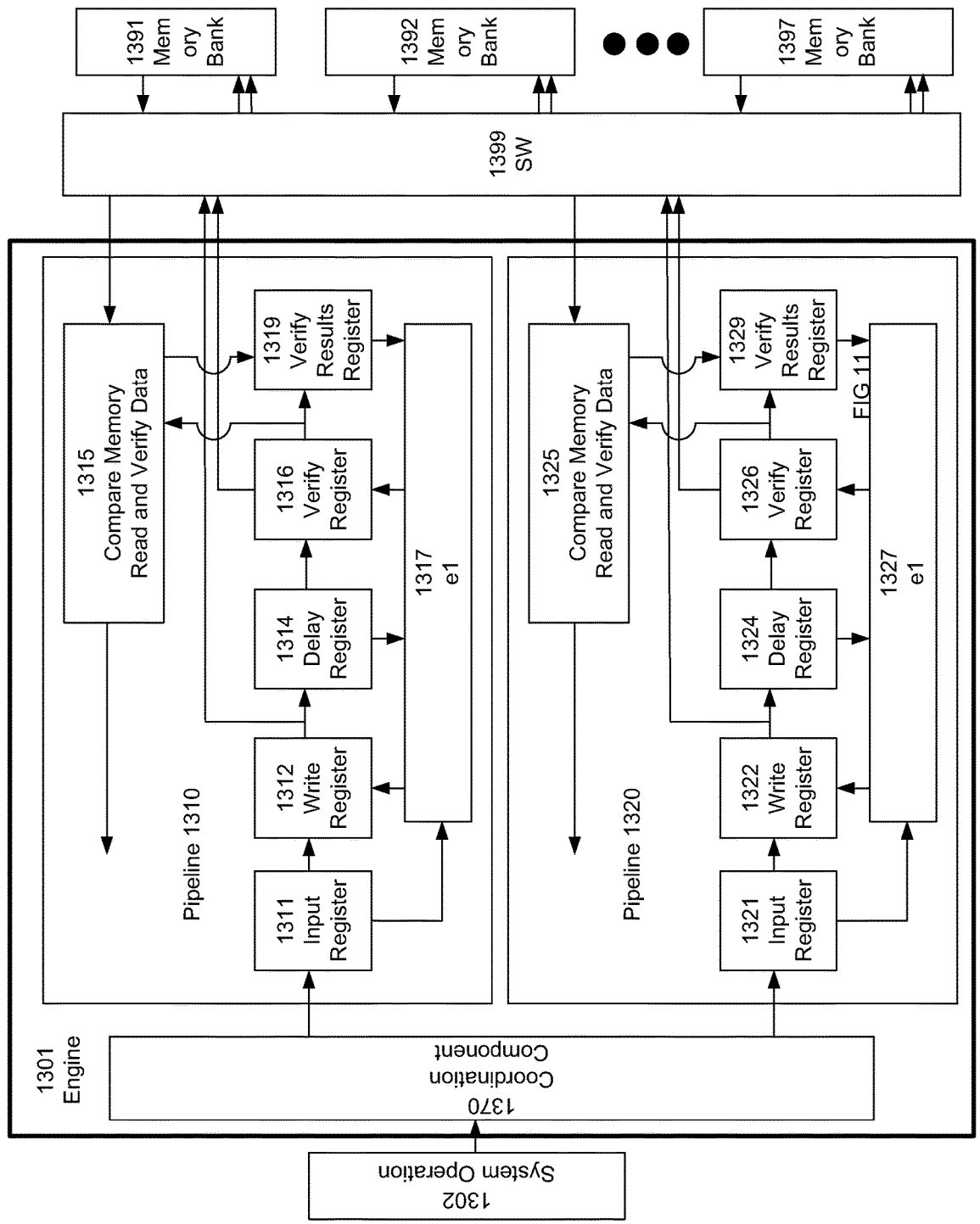
FIG. 14 is a block diagram of an exemplary selective coupling component in accordance with one embodiment.

It is appreciated that various coupling mechanisms can be utilized to couple a pipeline to a memory bank. In one embodiment, a selective coupling component (e.g., switch, multiplexer, de-multiplexer, crossbar, etc.) can be utilized to selectively couple a pipeline to a memory bank. FIG. 14 is a block diagram of an exemplary selective coupling component 1399 in accordance with one embodiment. Selective coupling component 1399 selectively couples pipelines 1310 and 1320 to a memory bank (e.g., 1391, 1392, 197, etc.). In one exemplary implementation, selective coupling component 1399 selectively couples pipeline 1310 to memory bank 1392 for a one system operation and later selectively couples pipeline 1310 to memory bank 1397 for another system operation. In one embodiment, selective coupling component 1399 ensures pipelines 1310 and 1320 are not coupled to the same memory bank at substantially the same time.

Embodiments can facilitate efficient and effective coordination between a MRAM component and different memory type controller. In one embodiment, the coordination permits a system configured to operate with a different memory type controller to realize benefits associated MRAM features. In one embodiment, benefits associated MRAM include minimal or no energy expended on refresh operations (e.g., less than conventional DRAM memory, etc.), relatively granular and precise access operations (e.g., on a word basis versus a page basis, etc.), minimal or no energy expended on preliminary page loading/managing, being readily compatible with and adaptable to requirements of other types of memory controllers (e.g., DRAM, DDR, etc.), and so on.

Some portions of the detailed descriptions are presented in terms of procedures, logic blocks, processing, and other symbolic representations of operations on data bits within a computer memory. These descriptions and representations are the means generally used by those skilled the arts to effectively convey the substance of their work to others skilled in the art. A procedure, logic block, process, etc., is here, and generally, conceived to be a self-consistent sequence of steps or instructions leading to a desired result. The steps include physical manipulations of physical quantities. Usually, though not necessarily, these quantities take the form of electrical, magnetic, optical, or quantum signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

The terms "first," "second," "third," "fourth," and the like in the description and in the claims, if any, are used for distinguishing between similar elements and not necessarily for describing a particular sequential or chronological order. It is to be understood that any terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

It should be borne in mind, however, that all of these and similar terms are associated with the appropriate physical quantities and are merely convenient labels applied to these quantities. Unless specifically stated otherwise as apparent from the following discussions, it is appreciated that throughout the present application, discussions utilizing terms such as "processing", "computing", "calculating", "determining", "displaying" or the like, refer to the action and processes of a computer system, or similar processing device (e.g., an electrical, optical, or quantum, computing device), that manipulates and transforms data represented as physical (e.g., electronic) quantities. The terms refer to actions and processes of the processing devices that manipulate or transform physical quantities within a computer system's component (e.g., registers, memories, other such information storage, transmission or display devices, etc.) into other data similarly represented as physical quantities within other components.

It is appreciated that embodiments of the present invention can be compatible and implemented with a variety of different types of tangible memory or storage (e.g., RAM, DRAM, flash, hard drive, CD, DVD, etc.). The memory or storage, while able to be changed or rewritten, can be considered a non-transitory storage medium. By indicating a non-transitory storage medium it is not intend to limit characteristics of the medium, and can include a variety of storage mediums (e.g., programmable, erasable, nonprogrammable, read/write, read only, etc.) and "non-transitory" computer-readable media comprises all computer-readable media, with the sole exception being a transitory, propagating signal.

It is appreciated that the specification includes a listing of exemplary concepts or embodiments associated with the novel approach. It is also appreciated that the listing is not exhaustive and does not necessarily include all possible implementation. The concepts and embodiments can be implemented in hardware. In one embodiment, the methods or process describe operations performed by various processing components or units. In one exemplary implementation, instructions, or directions associated with the methods, processes, operations etc. can be stored in a memory and cause a processor to implement the operations, functions, actions, etc.

It is appreciated that a memory storage management systems and methods can include the exemplary concepts or embodiments. It is also appreciated that the listing is not exhaustive and does not necessarily include all possible implementations. The concepts and embodiments can be implemented in hardware, firmware, software, and so on. In one embodiment, the following concepts include methods or processes that describe operations performed by various processing components or units. In one exemplary implementation, instructions or directions associated with the methods, processes, operations etc. can be stored in a memory and cause a processor to implement the operations, functions, actions, etc.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents. The listing of steps within method claims do not imply any particular order to performing the steps, unless explicitly stated in the claim.

What is claimed is:

1. A memory device comprising:
    an array of addressable memory cells, wherein said addressable memory cells of said array comprise magnetic random access memory (MRAM) cells and wherein further said array is organized into a plurality of banks;
    an error buffer operable to store write operations requiring a rewrite operation for storage into said array;
    a plurality of read/write pipelines operable to process read and write operations for said array; and
    an engine operable to control at least two read/write pipelines of said plurality of read/write pipelines and for controlling operations concerning said error buffer, and
    wherein, with respect to a particular bank having a first and a second read/write pipeline associated therewith, while said first read/write pipeline is processing a first plurality of read and/or write operations to one of the plurality of banks, but not yet finished, said second read/write pipeline is operable to commence processing a second read and/or write operation to another one of said plurality of banks.

2. A memory device of claim 1 wherein said first plurality of read and/or write operations to said one of the plurality of banks are directed to a particular page of said one of the plurality of banks and originate from a double data rate (DDR) interface issuing first memory operations to said particular page.

3. A memory device of claim 2 wherein said second plurality of read and/or write operations to said other one of the plurality of banks are directed to a particular page of said other one of the plurality of banks and originate from said DDR interface issuing second memory operations to said particular page.

4. A memory device of claim 3 wherein said engine comprises a pipeline scheduler coupled to said first and second read/write pipelines and operable to assign memory operations directed to said one of the plurality of banks between said first and second read/write pipelines.

5. A memory device of claim 1 wherein a burst word is read from said magnetic random access memory (MRAM) cells during time allotted by the DDR interface requirements to respond to a page activate command.

6. A memory device of claim 5, wherein a plurality of burst words corresponding to a bus width are read from said magnetic random access memory (MRAM) cells during time allotted by the DDR interface requirements to respond to a page activate command.

7. A memory chip comprising:
an array of addressable magnetic random access (MRAM) memory cells organized into a plurality of banks;
a plurality of error buffers operable to store write operations requiring a rewrite operation for storage into said array;
a plurality of read/write pipelines operable to process read and write operations for said array, wherein each bank of said plurality of banks has associated therewith at least two respective read/write pipelines of said plurality of read/write pipelines; and
a plurality of engines operable to control said plurality of read/write pipelines and for controlling operations concerning said plurality of error buffers, and
wherein, each engine of said plurality of engines is operable to control at least two respective read/write pipelines associated with a respective bank of said plurality of banks, and
with respect to a particular bank having a first and a second read/write pipeline associated therewith, while said first read/write pipeline is processing a first plurality of read and/or write operations to said particular bank, but not yet finished, said second read/write pipeline is operable to commence processing a second plurality of read and/or write operations to said particular bank.

8. A memory chip of claim 7 wherein said first plurality of read and/or write operations to said particular bank are directed to a particular page of said particular bank and originate from a DDR interface issuing first memory operations to said particular page.

9. A memory chip of claim 8 wherein said second plurality of read and/or write operations to said particular bank are directed to said particular page of said particular bank and originate from said DDR interface issuing second memory operations to said particular page.

10. A memory chip of claim 9 wherein said engine comprises a pipeline scheduler coupled to said first and second read/write pipelines and operable to assign memory operations directed to said particular bank between said first and second read/write pipelines.

11. A memory chip of claim 7 wherein a burst word is read from said magnetic random access memory (MRAM) cells during time allotted by the DDR interface requirements to respond to a page activate command.

12. A memory chip of claim 10, wherein a plurality of burst words corresponding to a bus with are read from said magnetic random access memory (MRAM) cells during time allotted by the DDR interface requirements to respond to a page activate command.

13. A memory chip comprising:
an array of addressable magnetic random access memory (MRAM) cells organized into a plurality of banks and a plurality of bank groups wherein each bank group comprises a respective set of banks;
a plurality of error buffers operable to store write operations requiring a rewrite operation for storage into said array;
a plurality of read/write pipelines operable to process read and write operations for said array, wherein each bank of said plurality of banks has associated therewith at least two respective read/write pipelines of said plurality of read/write pipelines; and
a plurality of engines operable to control said plurality of read/write pipelines and for controlling operations concerning said plurality of error buffers, and
wherein, each engine of said plurality of engines controls respective read/write pipelines associated with a respective bank group of said plurality of bank groups, and
with respect to a particular bank having a first and a second read/write pipeline associated therewith, while said first read/write pipeline is processing a first plurality of read and/or write operations to said particular bank, but not yet finished, said second read/write pipeline is operable to commence processing a second plurality of read and/or write operations to said particular bank.

14. A method of performing memory operations, said method comprising:
receiving at a memory device, a page open command from a DDR interface, for opening a page, wherein said memory device comprises:
an array of addressable magnetic random access memory (MRAM) cells organized into a plurality of banks;
an error buffer operable to store write operations requiring a rewrite operation for storage into said array;
a plurality of read/write pipelines operable to process read and write operations for said array, wherein each bank of said plurality of banks has associated therewith at least two respective read/write pipelines of said plurality of read/write pipelines; and
an engine operable to control at least two read/write pipelines of said plurality of read/write pipelines and for controlling operations concerning said error buffer;
receiving a first plurality of memory operations from said DDR interface directed to said page wherein said page resides within a particular bank of said plurality of banks;
directing said first plurality of memory operations to a first read/write pipeline associated with said particular bank for execution thereof;
before said first plurality of memory operations are complete, receiving a second plurality of memory operations from said DDR interface directed to said page;

directing said second plurality of memory operations to a second read/write pipeline associated with said particular bank for execution thereof; and receiving a page close command from said DDR interface.

15. A method of claim 14 wherein a burst word is read from said magnetic random access memory (MRAM) cells during time allotted by the DDR interface requirements to respond to a page activate command.

16. A method of claim 15, wherein a plurality of burst words corresponding to a bus width are read from said magnetic random access memory (MRAM) cells during time allotted by the DDR interface requirements to respond to a page activate command.

* * * * *